United States Patent
Snyder

(10) Patent No.: US 10,866,288 B2
(45) Date of Patent: Dec. 15, 2020

(54) DIGITAL INTERPOLATION OF SWITCH POINT TO REDUCE SWITCH POINT JITTER

(71) Applicant: Allegro MicroSystems, LLC, Manchester, NH (US)

(72) Inventor: Steven E. Snyder, New Boston, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 25 days.

(21) Appl. No.: 16/411,329

(22) Filed: May 14, 2019

(65) Prior Publication Data

US 2020/0363481 A1    Nov. 19, 2020

(51) Int. Cl.
*G01R 33/07* (2006.01)
*G01R 33/00* (2006.01)
(Continued)

(52) U.S. Cl.
CPC ......... *G01R 33/0041* (2013.01); *G01R 33/07* (2013.01); *G01R 33/09* (2013.01); *H03K 5/131* (2013.01); *H03K 5/135* (2013.01); *H03K 2005/00052* (2013.01); *H03K 2005/00058* (2013.01)

(58) Field of Classification Search
CPC ...... G01D 5/142; G01R 15/20; G01R 15/202; G01R 21/08; G01R 33/06; G01R 33/07; G01R 33/077; G01R 1/44; G01R 11/18; G01R 11/185; G01R 11/19; G01R 19/32; G01R 21/14; G01R 33/0082; G01J 5/16; G01K 7/10; G01L 19/0092
See application file for complete search history.

(56) References Cited

U.S. PATENT DOCUMENTS 4,555,765 A   11/1985   Crooke et al.
4,604,720 A    8/1986   Stikvoort
(Continued)

OTHER PUBLICATIONS

Notice of Allowance dated Jul. 27, 2017 for U.S. Appl. No. 14/599,789; 9 Pages.
(Continued)

*Primary Examiner* — Tung X Nguyen
(74) *Attorney, Agent, or Firm* — Daly, Crowley, Mofford & Durkee LLP

(57) ABSTRACT

A sensor is provided to include: a sampling clock circuit generating a sample clock signal with a predetermined sample clock period; a system clock circuit generating a system clock signal with a predetermined system clock period, wherein a value of the system clock period is less than a value of the sample clock period; a sensor circuit generating, during each sample clock period, a sensor signal representing a position of an object; a sampling circuit receiving the sensor signal and generate sample signal value in response; an interpolation circuit determining a first difference between a current sample signal and a previous sample signal, determining a second difference between a switchpoint threshold value and the previous sample signal, and determining a delay count based upon a ratio of the first difference and the second difference; and a switchpoint signal circuit generating a switchpoint signal based upon the delay count.

20 Claims, 8 Drawing Sheets

(51) Int. Cl.
    *H03K 5/135*    (2006.01)
    *H03K 5/131*    (2014.01)
    *G01R 33/09*    (2006.01)
    *H03K 5/00*     (2006.01)

(56) References Cited

U.S. PATENT DOCUMENTS

| | | | |
|---|---|---|---|
| 5,383,399 A * | 1/1995 | German | B41J 9/44 |
| | | | 101/93.01 |
| 8,446,146 B2 | 5/2013 | Foletto et al. | |
| 8,450,996 B2 | 5/2013 | Foletto et al. | |
| 8,680,848 B2 | 3/2014 | Foletto et al. | |
| 9,523,742 B2 | 12/2016 | Towne et al. | |
| 9,739,637 B2 | 8/2017 | Feucht et al. | |
| 9,797,961 B2 | 10/2017 | Feucht et al. | |
| 2017/0241801 A1* | 8/2017 | Fedtke | G01D 5/145 |

OTHER PUBLICATIONS

Office Action dated Nov. 16, 2016 for U.S. Appl. No. 14/599,789; 7 Pages.
Office Action dated Mar. 9, 2017 for U.S. Appl. No. 14/599,789; 8 Pages.
Response to Office Action dated Nov. 16, 2016 for U.S. Appl. No. 14/599,789, filed Feb. 15, 2017; 10 Pages.
Response to Office Action dated Mar. 9, 2017 for U.S. Appl. No. 14/599,789, filed Jun. 7, 2017; 9 Pages.
Response to Restriction Requirement dated Jun. 20, 2016 for U.S. Appl. No. 14/599,789, filed Aug. 17, 2016; 1 Page.
Restriction Requirement dated Jun. 20, 2016 for U.S. Appl. No. 14/599,789; 15 Pages.

* cited by examiner

DIGITAL INTERPOLATION OF SWITCH POINT TO REDUCE SWITCH POINT JITTER

TECHNICAL FIELD

The concepts, systems, circuits, devices and techniques described herein relate generally to sampling circuits and more particularly to magnetic field sensor circuits with a delayed output to reduce sampling error.

BACKGROUND

Magnetic field sensors including a magnetic field sensing element, or transducers, such as a Hall Effect element or a magnetoresistance element, are used in a variety of applications to detect aspects of the movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect a position of an engine crankshaft and/or camshaft, to detect the position and/or rotation of transmission elements, and to detect a position and/or rotation of an automobile wheel for anti-lock braking systems.

The magnetic field sensor may, for example, detect a magnetic field that changes as the system operates or rotates and convert the detected magnetic field into an electrical signal for processing. As an example, the magnetic field sensor may provide an output signal having a transition or edge which generally occurs when the electrical signal crosses a threshold. In many of these applications, the timing of the edge of the magnetic field detection (and the associated output signal) can be critical. This is particularly true in systems operating at high speed and/or systems where safety is important such as an anti-lock braking system for example. It can be important to precisely identify the time at which the electrical signal crosses the threshold. If the electrical signal is an analog signal, and the magnetic field sensor samples the analog signal at discrete time intervals, the threshold crossing will occur between samples, which can introduce a non-deterministic sampling error and degrade the timing accuracy of the output signal.

U.S. Pat. No. 9,797,961 discloses magnetic field sensor circuits having a delayed output signal with reduced sampling error. The delay period is determined using an analog solution.

SUMMARY

In accordance with the concepts, techniques and systems sought to be protected, described is a system and method for reducing sampling error by applying a digitally-computed delay count.

According to one illustrative embodiment, a magnetic field sensor may include: a sampling clock circuit generating a sample clock signal with a predetermined sample clock period; a system clock circuit generating a system clock signal with a predetermined system clock period, wherein a value of the system clock period is less than a value of the sample clock period; a sensor circuit generating, during each sample clock period, a sensor signal representing a position of an object; a sampling circuit receiving the sensor signal and generate sample signal value in response thereto. The sensor may further include an interpolation circuit configured to: determine a first difference between a current sample signal value and a previous sample signal value; determine a second difference between a switchpoint threshold value and the previous sample signal value; and determine a delay count based upon a ratio of the first difference and the second difference; and a switchpoint signal circuit configured to: generate a switchpoint signal based upon the delay count.

In one aspect, the switchpoint signal circuit may be further configured to: start a counter when a fixed duration passes after a detection of a switchpoint, wherein the counter increases for each system clock signal; and generate the switchpoint signal when the counter reaches the delay count. Here, the fixed duration may comprise the predetermined sample clock period. Here, the fixed duration may comprise a number of system clock signals to determine the delay count.

In one aspect, the delay count may be determined by multiplying the ratio by a number of system clock signals occurring in a sample clock period and applying a modulo operation to the number of the system clock signals.

In one aspect, the sensor circuit may comprise: one or more magnetic field sensors configured to detect an external magnetic field of the object.

In one aspect, the delay count may be determined digitally.

In one aspect, the delay count may be determined using a formula of:

$$\text{Delay Count} = \text{Int}\left(SC * \frac{\text{Threshold Difference}}{\text{Sample Difference}} \text{Mod}(SC)\right),$$

in which SC is a number of system clock signals occurring in a sample clock period.

According to another illustrative embodiment, a method may include: generating a sample clock signal with a predetermined sample clock period; generating a system clock signal with a predetermined system clock period, wherein a value of the system clock period is less than a value of the sample clock period; generating, during each sample clock period, a sensor signal representing a position of an object; receiving the sensor signal and generate sample signal value in response thereto; determining a first difference between a current sample signal value and a previous sample signal value; determining a second difference between a switchpoint threshold value and the previous sample signal value; determining a delay count based upon a ratio of the first difference and the second difference; and generating a switchpoint signal based upon the delay count.

In one aspect, the method may further include: starting a counter when a fixed duration passes after a detection of a switchpoint, wherein the counter increases for each system clock signal; and generating the switchpoint signal when the counter reaches the delay count.

The details of one or more embodiments of the disclosure are outlined in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which.

DETAILED DESCRIPTION

Figure 1:
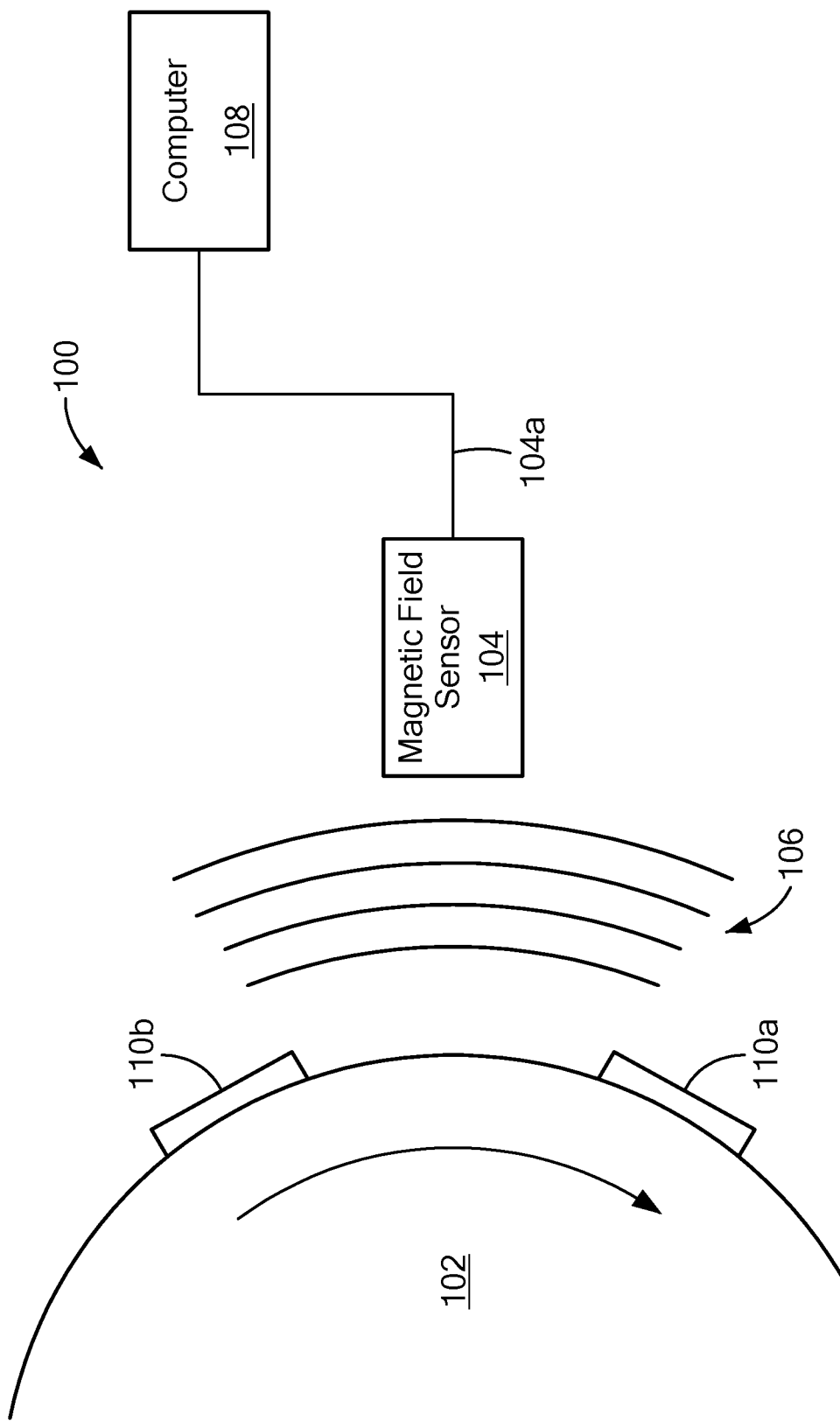
FIG. 1 is a block diagram of a system for detecting a magnetic target including a magnetic field sensor and a computer.

All relative descriptions herein, such as left, right, up, and down, are with reference to the figures, are merely relative and not meant in a limiting sense. Additionally, for clarity, common items and circuitry, such as integrated circuits, resistors, capacitors, transistors, and the like, have not necessarily been included in the figures, as can be appreciated by those of ordinary skill in the pertinent art. Unless otherwise specified, the described embodiments may be understood as providing illustrative features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

Certain introductory concepts and terms used in the specification are collected here.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, for example, a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, such as Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g., a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic. As is known in the art, magnetic fields have direction and strength. The strength of a magnetic field can be described as magnetic flux or flux density. Therefore, the terms magnetic field "strength" and magnetic "flux" may be used interchangeably in this document.

As is known in the art, magnetic fields have direction and strength. The strength of a magnetic field can be described as magnetic flux or flux density. Therefore, the terms magnetic field "strength" and magnetic "flux" may be used interchangeably in this document.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "jitter (also known as 'repeatability')" is used to describe the deviation from true periodicity of a presumably periodic signal. The jitter is generally related to a reference clock signal. Jitter may be caused by electromagnetic interference and crosstalk with carriers of other signals. In the context of the current invention, jitter may also be caused by a gap between an actual timing of an event and a time that the event is reported.

As used herein, the term "latency" is used to describe a time interval between an event that is being observed and a response to the event. Alternatively, the latency may be a time delay between the cause and the effect of a physical change from the cause in a system.

Figure 1A:
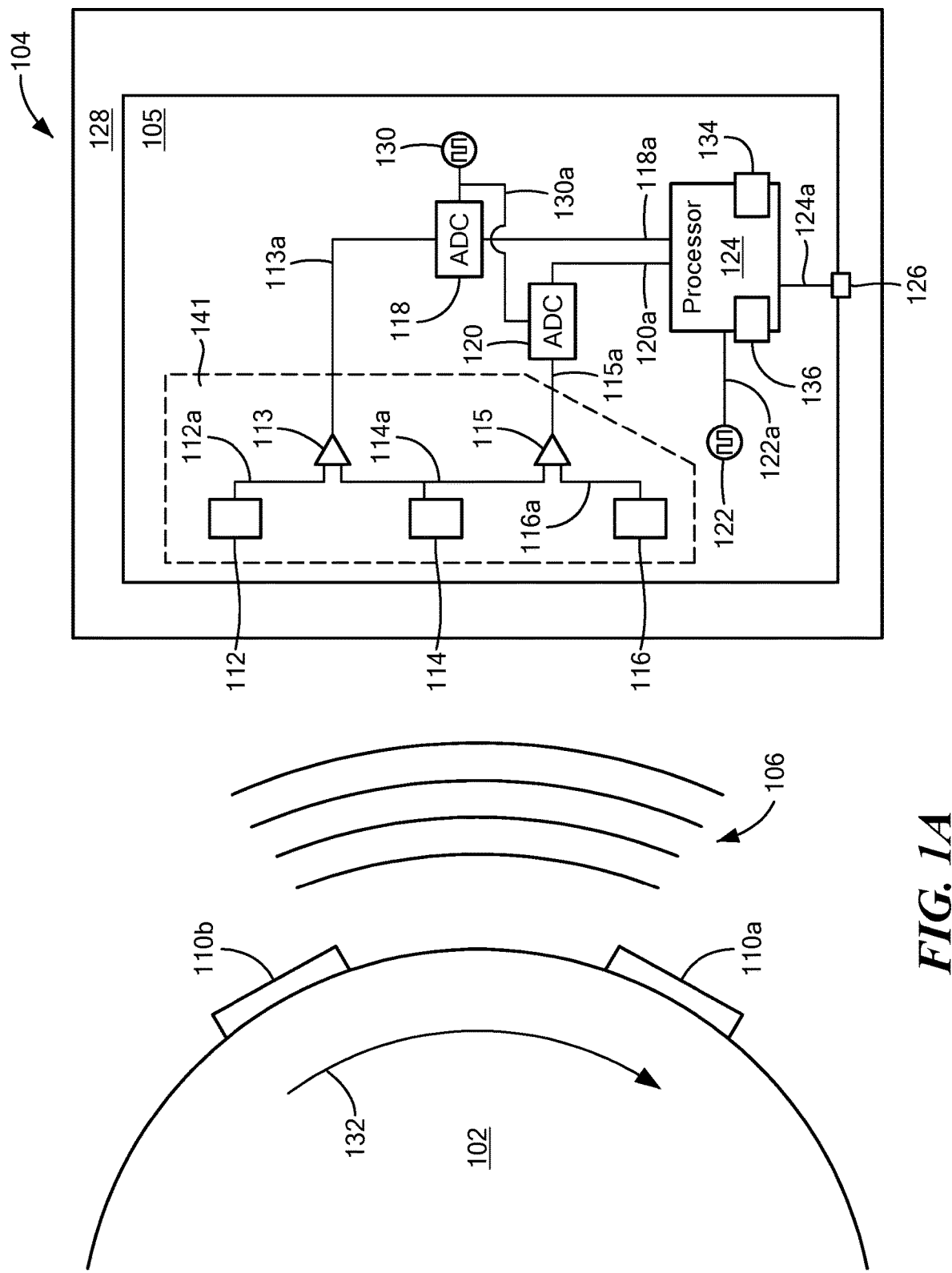
FIG. 1A is a block diagram of a system for detecting a magnetic target and applying a digitally computed delay to an output signal.

FIG. 1 is a block diagram of a system 100 for detecting a target 102. System 100 includes a magnetic field sensor 104 placed adjacent to target 102 so that a magnetic field 106 can be sensed by magnetic field sensor 104. In an embodiment, as shown in FIG. 1A, magnetic field sensor 104 may include one or more integrated circuits 105 supported by substrate 128. Although not shown, magnetic field sensor 104 may also include any appropriate package, lead frame, lead wires, etc. Further, magnetic field sensor 104 may include multiple substrates 128 that each support a portion of the circuits and other elements that comprise magnetic field sensor 104.

In an embodiment, target 102 is a magnetic target and produces magnetic field 106. In another embodiment, magnetic field 106 is generated by a magnetic source (e.g., a back-bias magnet or electromagnet) that is not coupled to target 102. In such embodiments, target 102 may be a ferromagnetic target that does not itself tend to generate a magnetic field. In the case where the target is a ferromagnetic target, as target 102 moves through or within magnetic field 106 generated by a back-bias magnet or electromagnet, it causes perturbations to magnetic field 106 that can be detected by magnetic field sensor 104.

Magnetic field sensor 104 may be coupled to a computer 108, which may be a general-purpose processor executing software or firmware, a custom processor, or an electronic circuit for processing output signal 104a from magnetic field sensor 104. Output signal 104a may provide information about the speed and direction of target 102 to computer 108, which may then perform operations based on the received speed and direction. In an embodiment, magnetic field sensor 104 changes the state of output signal 104a when the detected magnetic field crosses a predetermined threshold.

In an embodiment, computer 108 is an automotive computer installed in a vehicle and target 102 is a moving part within the vehicle, such as a transmission shaft, a brake rotor, etc. The magnetic field sensor 104 detects the speed and direction of target 102 and computer 108 controls automotive functions (like all-wheel drive, ABS, etc.) in response to the detected speed and direction.

Target 102 can comprise any element capable of affecting magnetic field 106 through motion or proximity. For example, target 102 may be attached to a rotating shaft in an automotive transmission or brake system.

As shown in FIG. 1, target 102 may be a gear having teeth 110a. As target 102 moves or rotates, teeth 110a affect magnetic field 106, which can be detected by magnetic field sensor 104. By detecting such changes to magnetic field 106, system 100 can determine the speed and/or direction of target 102. Although shown as a rotating gear, target 102 can take on any form capable of being detected by magnetic sensor including, but is not limited to: a toothed rack in a rack and pinion system; a gear; a gear with teeth, with magnets (e.g., a ring magnet), or other features on or attached to a shaft; etc. Further, although shown as separate elements, computer 108 and magnetic field sensor 104 may be part of the same circuit, part of the same integrated circuit, or contained in the same package.

Referring now to FIG. 1A, magnetic field sensor 104 may include a sensor circuit 141. The sensor circuit 141 may include one or more magnetic field sensing elements 112, 114, 116, which provide signals to differential amplifiers 113 and 115. The outputs (i.e., sensor signals) 113a, 115a of the differential amplifiers are received by analog-to-digital converters (ADCs) 118 and 120, respectively. In the embodiment shown, ADC 118 and ADC 120 may take discrete time samples of signals 113a and 115a and provide a sample data (or discrete time digital signals) 118a and 120a to processor 124. ADC 118 and 120 may receive a sample clock signal 130a from a sample clock 130. The sample clock signal 130a may trigger sampling by the ADCs 118, 120.

As shown, in the illustrative embodiment of FIG. 1A, the sensor circuit 141 of the magnetic field sensor 104 may include one or more magnetic field sensing elements 112, 114, 116. The magnetic field sensing elements 112, 114, 116 are positioned adjacent to target 102 to detect magnetic field 106. Each magnetic field sensing element provides a respective output signal 112a, 114a, or 116a, which represent the magnetic field as detected by magnetic field sensing element 112, 114, and 116, respectively. The magnetic field sensing elements 112, 114, and 116 may be Hall Effect elements, magnetoresistive elements, or other suitable types of magnetic field sensing elements.

Differential amplifier 113 receives signal 112a and 114a, and differential amplifier 115 receives signals 114a and 116a. The output of differential amplifier 113 corresponds to a position of target 102 in relation to the magnetic field sensing elements 112 and 114. Similarly, the output of differential amplifier 115 may correspond to a position of target 102 in relation to the magnetic field sensing elements 114 and 116. Signals 113a and 115a are received by ADC 118 and ADC 120, respectively. Although not shown in FIG. 1A, magnetic field sensor 104 may include filters or other signal-shaping circuits to condition and shape signals 113a and/or 115a prior to them being received by ADCs 118 and 120.

Processor 124 may be a circuit that processes sample data 118a and 120a, and may provide output signal 124a. Signals 118a and 120a may represent detection of passing features, e.g., gear teeth, of magnetic target 102. Thus, processor 124 may process these signals and provide output signal 124a so that output signal 124a carries information about magnetic target 102, such as speed, direction, etc.

Processor 124 may be a circuit specifically designed to process signals 118a and 120a and/or to perform other functions. In another embodiment, processor 124 is a general purpose or custom processor executing software, firmware, micro-code, or any other type of executable instructions in order to process signals 118a and 120a and/or to perform other functions.

In an embodiment, processor 124 includes an interpolation circuit 134 configured to interpolate values between measured samples of discrete time signals. It should be appreciated that the illustrative embodiment of FIG. 1A includes two signal channels: a first signal channel along which signals 118a propagate and a second signal channel along with signals 120a propagate. It should be understood that the interpolation described herein may take place on a single one of the channels. For example, interpolation may take place between a sample 118a and another sample 118a (i.e. between two samples of signal 118a). Interpolation may also take place between two samples of signal 120a. It should be appreciated that the illustrative circuit of FIG. 1A includes two channels since two channels are needed to determine direction of rotation while only one channel is needed to determine speed of rotation.

As is known, interpolation is the estimation of a value between two points in a series of values collected (i.e., sampled) from a particular channel, based on one, two, or more points within the series. Thus, interpolation circuit 134 may be configured to estimate a value of signal 118a and/or 120a based on two or more of the samples collected from channels 118 and/or 120 respectively. That is, for example, the value of signal 118a may be estimated (i.e., interpolated) based upon sample data from ADC 118 of the respective channel.

Particularly, interpolation circuit 134 may, for a single channel, determine a ratio between a difference of a current sample signal value and a previous sample signal value and a difference of a switchpoint threshold value and the previous sample signal value on the channel. Interpolation circuit 134 further determines a delay count based upon the ratio. The process for determining the delay count will be described below in detail in conjunction with FIGS. 3-5. In some embodiments, similar to processor 124, interpolation circuit 124 may be a custom circuit or a general-purpose processing circuit that executes instructions. In another embodiment, if processor 124 is a processor that executes instructions, interpolation circuit 134 may be replaced by instructions that cause processor 124 to perform interpolations based on signal 118a and/or 120a.

Processor 124 may also include a switchpoint signal circuit 136 to generate a switchpoint signal based upon the delay count, discussed below in greater detail. Similar to interpolation circuit 134, switchpoint signal circuit 136 may be a custom circuit, a processor configured to generate a switchpoint signal, or may be implemented as instructions which, when executed by processor 124, cause a switchpoint signal. In the example shown in FIG. 1A, interpolation circuit 134 and switchpoint signal circuit 136 are part of processor 124. In another embodiment, interpolation circuit 134 and switchpoint signal circuit 136 may be separate from processor 124, integrated into the ADCs 118 and/or 120, or may be incorporated in other arrangements within magnetic field sensor 104.

The embodiment shown in FIG. 1A includes three magnetic field sensing elements with differential amplifiers. However, other arrangements are possible. For example, if the differential amplifiers are removed, magnetic field sensor 104 may have two magnetic field sensing elements, each coupled to one of the ADCs. In this embodiment, one of the magnetic field sensing elements may provide signal 113a to ADC 118, and the other magnetic field sensing element may provide signal 115a to ADC 120. Other arrangements having one magnetic field sensing element (and one ADC) or more than three magnetic field sensing elements can also be used.

One skilled in the art will note that, if sensor 104 includes only one magnetic field sensing element, such as magnetic field sensing element 112, and teeth 110a are regularly spaced and shaped, then sensor 104 may be able to detect only speed, e.g., of rotation, of target 102 by counting (for example) the times that teeth 110a and 110b are detected over a particular time period. That is, an interpolation may happen on a single channel between a sample from an ADC and another sample from the same ADC (e.g. one of ADC's 118 or 120). Accordingly. the inventive concepts described herein may operate on a signal channel. It is, of course, possible to perform interpolation on each of two or more signal channels (i.e. it is possible to perform interpolation on respective ones of two different signal propagation on respective channels). If sensor 104 contains more than one magnetic field sensing element, sensor 104 can also detect direction, e.g., of rotation, by measuring a phase between the signals, e.g., 113a, 115a. of the magnetic field sensing elements. In the embodiment shown in FIG. 1A, sensor 104 can detect speed by measuring the number of times signal 113a and/or 115a indicates that a tooth was detected over a particular time period. Additionally or alternatively, sensor 104 can detect the direction of target 102 by measuring the phase between signals 113a and 115a. It will be understood that speed and/or direction information can be encoded in the output signal 124a in a variety of ways.

Magnetic field sensor 104 can include an oscillator 122 that provides an oscillating output 122a. Oscillator 122 may be non-crystal oscillator circuit (or a crystal oscillator circuit) and oscillating output 122a may be used as a system clock signal. Magnetic field sensor 104 may also include an oscillator 130, which may be a crystal or non-crystal oscillator, that provides an oscillating output 130a to ADC 118 and ADC 120 that may be used as a sample clock that triggers sampling by ADCs 118 and 120. Although not shown, sample clock signal 130a may also be received by processor 124. In an embodiment, each ADC may be coupled to separate oscillator circuits (not shown).

Signals 118a and 120a are received by processor circuit 124, which uses signals 118a and 120a to compute speed and/or direction of target 102. Processor 124 provides output signal 124a, which may be coupled to output port 126 so that signal 124a can be received by an external circuit (e.g., automotive computer 108 in FIG. 1). Output signal 124a may be the same as or similar to signal 104a shown in FIG. 1.

In operation, magnetic target 102 moves or rotates relative to magnetic field sensor 104. The relative movement causes changes or perturbations to magnetic field 106, which are detected by magnetic field sensing elements 112, 114, and/or 116. When the magnetic field sensed by magnetic field sensing element 112 is relatively strong, the voltage (or current) level of signal 112a will be relatively high. Likewise, when the magnetic field sensed by magnetic field sensing elements 114 and 116 is relatively strong, the voltage (or current) levels of signals 114a and 116a will be relatively high. Magnetic field sensing elements 112, 114, and 116 can also be configured so that the signals 112a, 114a, and 116a are relatively low when the magnetic field sensing elements detect a relatively strong magnetic field.

As teeth 110a and 110b move relative to the magnetic field sensing elements, the magnetic field sensing elements detect changes in magnetic field 106. As tooth 110b rotates past magnetic field sensing element 112 in the direction of arrow 132, signal 112a indicates that a tooth is detected. Subsequently, as tooth 110b moves past magnetic field sensing element 114, signal 114a indicates that a tooth is detected. Likewise, as tooth 110b rotates past magnetic field sensing element 116, signal 116a indicates that a tooth is detected.

Differential amplifier 113 receives signals 112a and 114a and generates signal 113a, which represents a voltage difference between signals 112a and 114a. Similarly, differential amplifier 115 provides signal 115a, which represents a voltage difference between signals 114a and 116a. ADC 118 then samples and signal 113a and converts it to sample data 118a, and ADC 120 samples signal 115a and converts it to sample data 120a. Sample data 118a and 120a are received by processor 124, which processes the signals to determine speed and direction of target 102 and to generate output signal 124a.

In an embodiment, processor 124 is configured to determine when sample data 118a and 120a cross respective predetermined thresholds (i.e., switch point), the crossings of which may indicate that tooth 110a or 110b has been detected. Processor 124 may then produce output signal 124a to carry information about the speed and direction and/or information about whether a tooth 110a or 110b was detected, to an external circuit or processor for subsequent processing. In an embodiment, processor 124 can also indicate an error condition, e.g., by altering a voltage level of signals 124a. For example, processor 124 may generate a DC offset on signal 124a, which can be received by external circuitry, to indicate an error condition.

In an embodiment, sample data 118a and signal 120a are digital representations of analog signals 113a and 115a. In such an embodiment, if signals 118a and 120a are plotted on a graph, the shape, amplitude, and timing of signals 118a and 120a generally comports to the shape, amplitude, and timing of signals 113a and 115a.

Figure 2A:
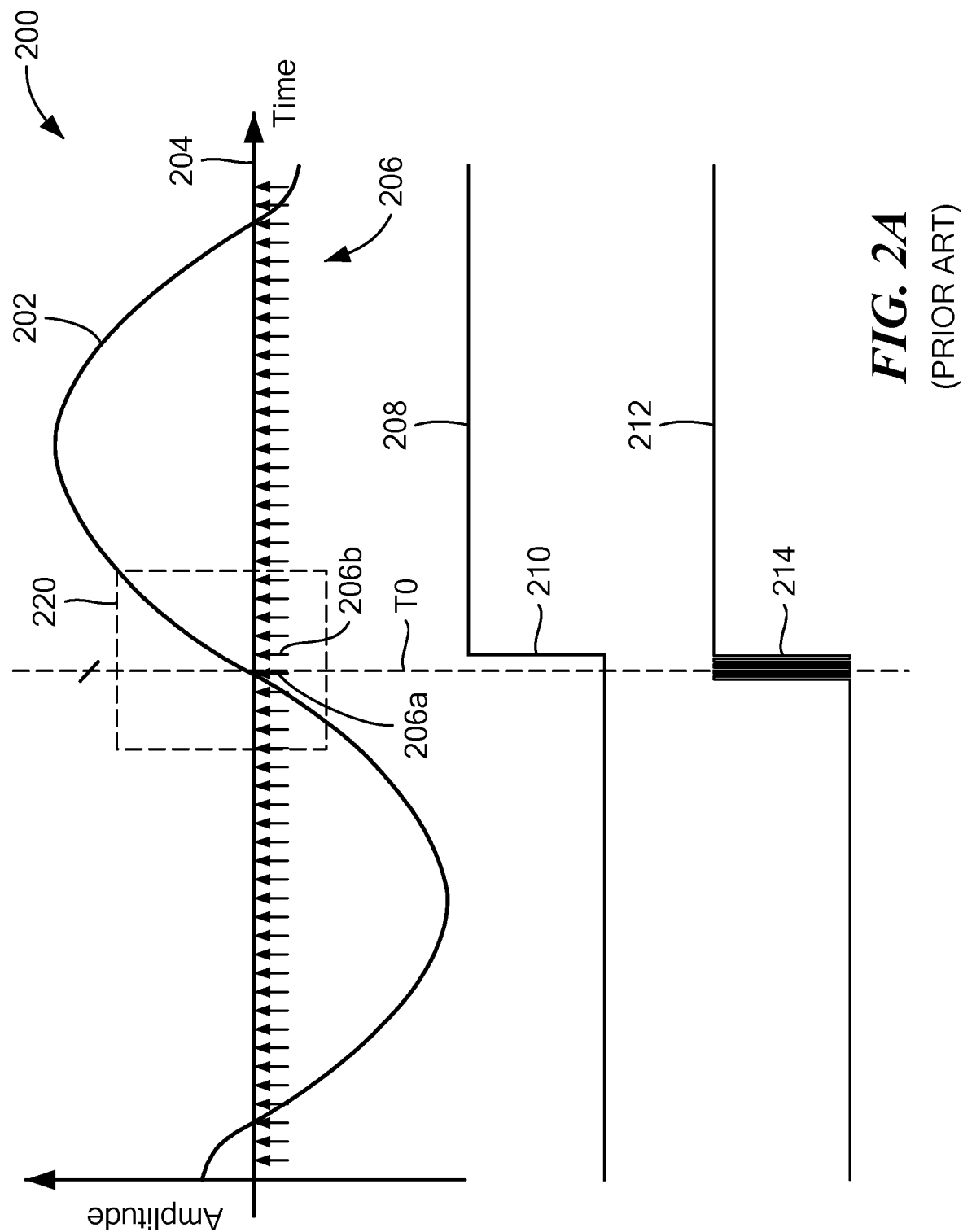
FIG. 2A is a timing diagram of a magnetic field signal illustrating a sampling error.

Turning to FIG. 2A, a timing diagram 200 illustrates sampling error that can be introduced in sampling systems of the prior art. A horizontal axis represents time in arbitrary units and a vertical axis represents voltage in arbitrary units. (In other examples, the vertical axis may represent other measurable signal attributes such as current, power, etc.). Signal 202 is an analog signal that is received by a discrete time sampling circuit. Waveform 202 may be similar to signal 113a or 115a, for example. Arrows 206 represent times at which signal 202 is sampled. As shown, signal 202 crosses threshold 204 at time T0, a time just after sample 206a is taken. Thus, the threshold crossing is not detected until the next sample 206b is taken.

Signal 208 is an output signal generated when the threshold crossing is detected. State transition 210 from low to high indicates the crossing. Even though the threshold crossing occurred prior to sample 206b, the prior art system does not detect the crossing and change the state of the output signal 208 until sample 206b is taken.

Signal 212 is an overlay of multiple, ideal signals that represent actual threshold crossings between samples 206a and 206b. For example, in an operating magnetic field sensor, on other cycles of the signal 202, the threshold crossings can occur at any time between samples. Thus, some crossings may occur closer in time to sample 206a and others may occur closer in time to 206b. Accordingly, if many crossings are overlaid onto the same graph, the crossings will be distributed between sample 206a and 206b as shown by bar 214. Because the prior art system can only detect the crossing once sample 206b is taken, the output will change state only at the time of sample 206b. Thus, for any one cycle of the signal 202, there is a non-deterministic error between the time the actual crossing occurs and the time the output changes state to indicate that a crossing occurred. This error can be represented as: $T_{ERR}=T_{SAMPLE}-T_{CROSSING}$, where $T_{ERR}$ is the error, $T_{CROSSING}$ is the time at which the actual crossing occurred, and $T_{SAMPLE}$ is the time of the next sample taken after the crossing occurred. Note that the overlay as shown in signal 212 may be similar to a so-called eye diagram or eye pattern function of an oscilloscope.

Figure 2B:
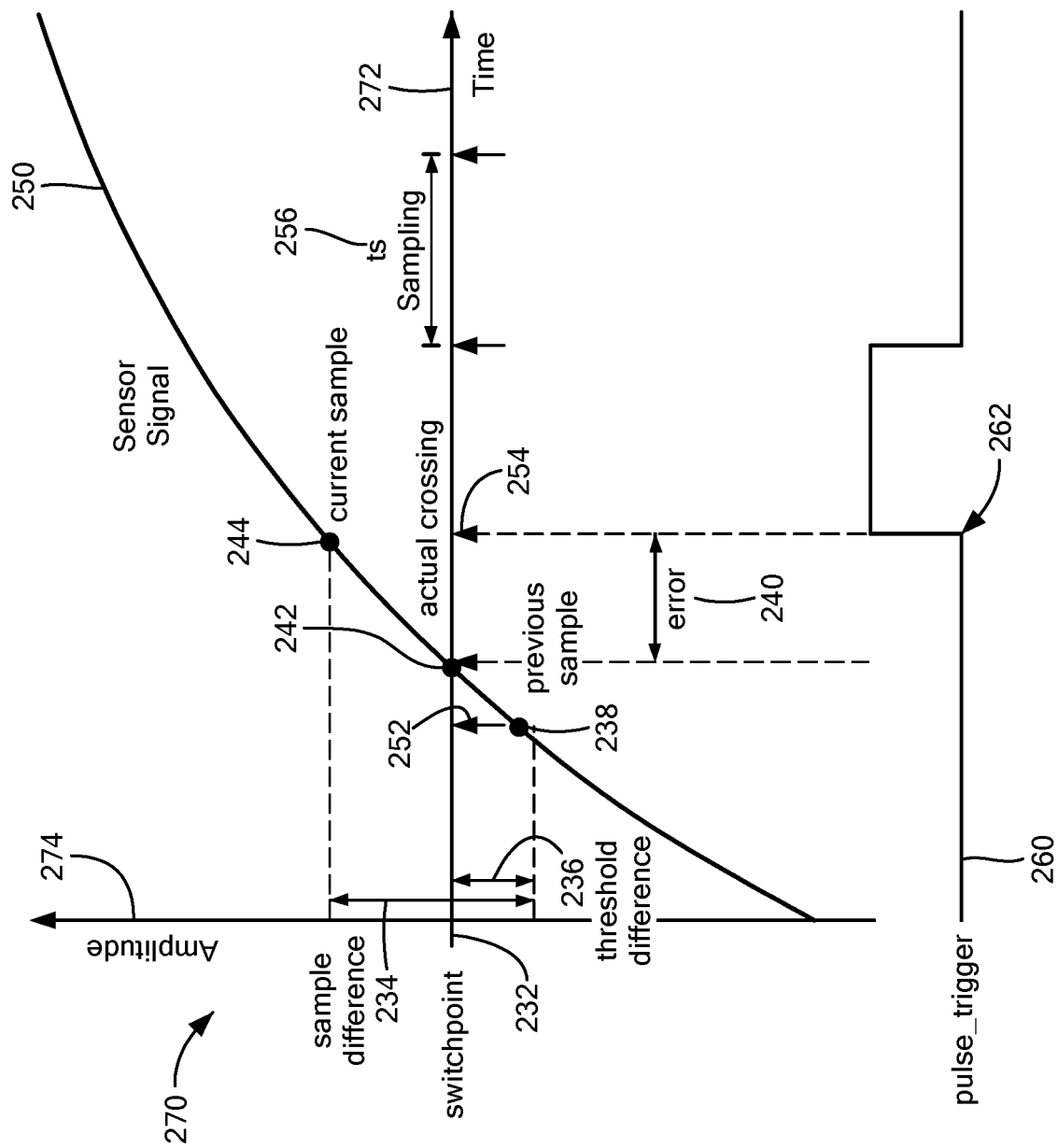
FIG. 2B is a timing diagram of a magnetic field signal illustrating a sampling error in more detail.

Referring now to FIG. 2B, in accordance with the concepts described herein, it has been recognized that prior art systems may introduce a sampling error and a timing diagram 270 illustrates sampling error that can be introduced in sampling systems of the prior art. The graph 270 shows area 220 of FIG. 2A in more detail. A horizontal axis 272 represents time in arbitrary units (e.g. milliseconds or microseconds) and a vertical axis 274 represents voltage or other measurable signal attributes such as current or power in arbitrary units (e.g. volts, millivolts, microvolts, amperes, milliamperes or microamperes, watts, milliwatts or microwatts). Signal 250 is an analog signal that is received by a discrete time sampling circuit. Arrows 252, 254 represent times at which signal 250 is sampled based upon sampling clock signals from a sampling clock (e.g., a sampling clock 130 in FIG. 1A). The sampling clock 130 generate a sample clock with a predetermined sample clock period 256. The horizontal axis 272 relative to the vertical axis 274 represents a switchpoint threshold 232. As shown, signal 250 crosses threshold 232 at a point 242. A previous sample 252 is taken before the actual crossing 242 and a current sampling 254 is taken after the actual crossing 242. Accordingly, the actual threshold crossing 242 is not detected until the current sampling 254 is taken. An error 240 corresponding to the time 240 between the actual crossing 242 and the current sampling 254 is occurring. This error can be represented as: $T_{ERR}=T_{SAMPLE}-T_{CROSSING}$, as described above.

The signal 260 represents an output signal (e.g., output signal 208 in FIG. 2A) according to the detected threshold crossing. A crossing pulse 262 is triggered when the switching is detected at the current sampling 254. As described above, the crossing pulse 262 is triggered incorrectly by the amount ($T_{ERR}$) of the error 240.

The differences of the sensor signal 250 between the threshold 232 and the previous sample 228, and the current sample 244 and the previous sample 238 may be identified as threshold difference 236 and sample difference 234 respectively. These values will be used to determine a delay count (e.g., 356 in FIG. 3) as described in detail in conjunction with FIGS. 3-5.

Figure 3:
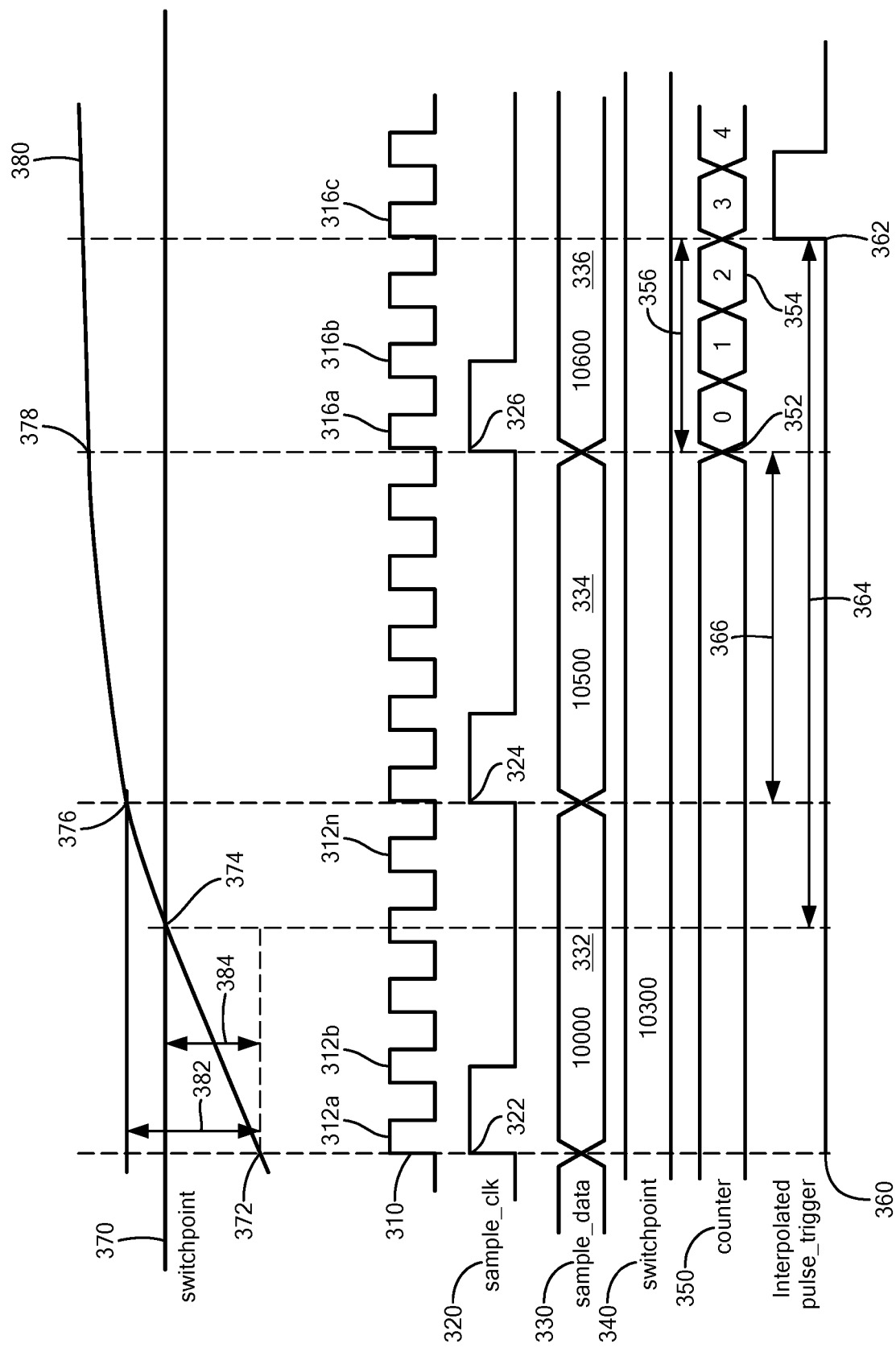
FIG. 3 is a timing diagram illustrating a switchpoint signal generated based upon an embodiment.

Referring now to FIG. 3, a timing diagram 300 illustrates a switchpoint signal generated based upon an embodiment described herein in which a system clock operates at a frequency which is higher than a frequency at which a sample cloth operates. Signal 310 represents system clock pulses generated by a system clock (e.g., system clock 122 in FIG. 1A). The system clock pulses 312a, 312b, . . . 312n are generated according to a predetermined system clock period. Signal 320 represents sample clock pulses generated by a sample clock (e.g., sampling clock 130 in FIG. 1A). The sample clock pulses 322, 324 are generated according to a predetermined sample clock period. The value of the system clock period is less than a value of the sample clock period. In embodiments, a number of system clock pulses occurring in a sample clock period is constant. The embodiment in FIG. 3 shows that five (5) system clock pulses are generated per one (1) sample clock pulse. However, it should be appreciated that the number of system clock pulses occurring in a sample clock period can have a different value (i.e., fewer or greater than five system clock pulses per sample clock pulses).

Sample data 330 shows the value of sample data from sensor signal 380 that is detected at each sampling. This sample data is discrete time digital signals (e.g., sample data 1118a, 120a in FIG. 1A) provided by the analog-digital converter (e.g., ADC 118, 120 in FIG. 1A). For example, for sample clock 322, the sensor signal 380 is detected at point 372 to have a sample data value of 10000. Further, the sensor signal 380 has a sample data value of 105000 and 10600 for sample clock 324 and 326 respectively at points 376 and 378. Switchpoint value 340 shows a data value corresponding to a crossing switchpoint threshold 370. Here, the threshold value is 10300. Pulse trigger signal 360 represents a switchpoint crossing signal, which is generated for a detected switchpoint. In a similar way to the examples described in conjunction with FIGS. 2A-2B, an actual crossing may happen between samplings 322, 324. For example, the sensor signal 380 crosses the threshold 370 at point 374 when the sensor signal has a sample data value of 10300, which is between sample clock pulse 322 when the sensor signal has a sample data value of 10000 and sample clock pulse 324 when the sensor signal has a sample data value of 10500. The switchpoint (i.e., crossing) 374 is not detected until the next sampling 324. Accordingly, an error due to the gap between the actual crossing 374 and the next sampling 324 may occur.

As described in conjunction with FIG. 2A, the actual crossing may happen at any point between sample clock pulses (e.g., the area 214 between 206a, 206b in FIG. 2A). Accordingly, there may be a non-deterministic error between the time the actual crossing occurs and the time the output changes state (e.g., pulse trigger 262 in FIG. 2B) to indicate that a crossing occurred. This non-deterministic error may cause 'jitter', which refers to an undesirable variation in the periodicity of an asynchronous signal. For example, where the asynchronous signal is provided by the detector output signal (i.e., comparator output signal), variations in the frequency of transitions of the comparator output signal can be attributable to factors other than the actual features or movement of the target and thus adversely affect the accuracy with which the detector output signal reflects the actual speed and/or position of the target. A digital representation of the signal is used to represent the time of crossing the active switchpoint threshold by comparing the current and previous sample to the threshold. A delay count is determined based on the estimated time of crossing and this delay count may be used to reduce (or preferably minimize) the jitter caused by the non-deterministic error between the time the actual crossing occurs and the time the output changes state. In embodiments, the delay count 356 is determined based upon the ratio of sample difference 382 and threshold difference 384. The sample difference 382 is an absolute difference between the current sample data 376 (also 334) and the previous sample data 372 (also 332). The threshold difference 384 is an absolute difference between the threshold 370 (also 340) and the previous sample data 372 (also 332). In the illustrated example in FIG. 3, the sample difference is 500 (=10500−10000) and the threshold difference is 300 (=10300−10000). A ratio is calculated as (threshold difference)/(sample difference). Thus, in the illustrated example, the ratio is 3/5.

The calculated ratio is then multiplied by the number of system clock pulses (SC) occurring in a sample clock period, and a modulo operation is applied to the calculated value to the number of system clock pulses. In embodiments, the multiplication of SC may occur in binary arithmetic to preserve the precision of the values. Here, the delay count is calculated according to the following formula.

$$\text{Delay Count} = \text{Int}\left(SC * \frac{\text{Threshold Difference}}{\text{Sample Difference}} \text{Mod}(SC)\right) \quad (1)$$

In embodiments, an interpolation circuit (e.g., 134 in FIG. 1A) calculates the ratio and determines a delay count. In the illustrated example, the delay count is calculated as below. The calculated delay count is three (3).

$$\text{Delay Count} = \text{Int}\left(5 * \frac{(10300 - 10000)}{(10500 - 10000)} \text{Mod} 5\right) = 3$$

When a switchpoint crossing is detected at a sampling clock (e.g., switchpoint 374 is detected at sample clock 324), a switchpoint signal is generated by applying the delay count after a fixed duration (e.g., one sample period). The delay count matches with the system clock pulses. In embodiments, a switchpoint signal circuit (e.g., 136 in FIG. 1A) generates the switchpoint signal. For example, after a switchpoint is detected at 324, the switchpoint signal circuit applies a determined delay count 356 after a sample clock period. Accordingly, a counter for the delay count starts at 352. After three (3) delay count 354 (i.e., three system clock pulses), a switchpoint signal is generated at 362.

Therefore, a switchpoint signal 362 is generated when a delay count is reached after a fixed duration 366 (i.e., one sample clock period). In embodiments, the delay count is determined during the fixed duration 366. In embodiments, the fixed duration 366 is determined according to one sample clock period or the time (i.e., number of system clocks) to calculate the delay count. The fixed duration 366 should be longer than the time to calculate the delay count. That is, the switchpoint signal 362 is generated after a delay 364. Here, the delay count is determined based upon an estimation of when an actual crossing 374 happens between two sample clocks 332, 324. Since the same fixed duration is applied along with the determined delay count, the delay 364 between the actual crossing 374 and the switchpoint signal generation 362 is substantially constant. Accordingly, the non-deterministic error between the actual crossing 374 and the switchpoint signal generation 362 may be reduced or minimized. For example, in the illustrative embodiment, the range of error between actual crossing and switchpoint signal may be improved by 5:1 ratio. That is, the range of error could be brought down to ~10 ns from ~50 ns of a conventional method.

The delay 364 creates latency between actual crossing and switchpoint signal. That is, a switchpoint signal is always generated after a certain period. The latency is substantially constant unlike the jitter which is non-constant. Adding latency is in general not desirable, but it has been recognized that if latency, in accordance with the concepts described herein, can be limited in duration (e.g., limited to be on the order of one sample period (i.e. one or two sample clock cycles) or less; or in some embodiments, limited to be on the order of one or two system clock periods (i.e. one or two system clock cycles), the latency can be accounted for in the overall system operation. The amount of latency is dependent on the implementation. In the illustrative embodiments described herein, the latency is relatively small compared with the overall signal switching period, which produces a substantially small (preferably minimal) effect to the overall system operation. In embodiments, the latency may be an order of magnitude less (or multiple orders of magnitude less) than the interval between switchpoints. In embodiments, the range may be from 1 to 50 clock cycles. In embodiments the range may be 1 to 2 clock cycles. In embodiments, the range may be 5-10 clock cycles. In still other embodiments, the range may be 15-20 clock cycles. The particular latency for a specific application will depend upon the specific implementation.

Figure 4:
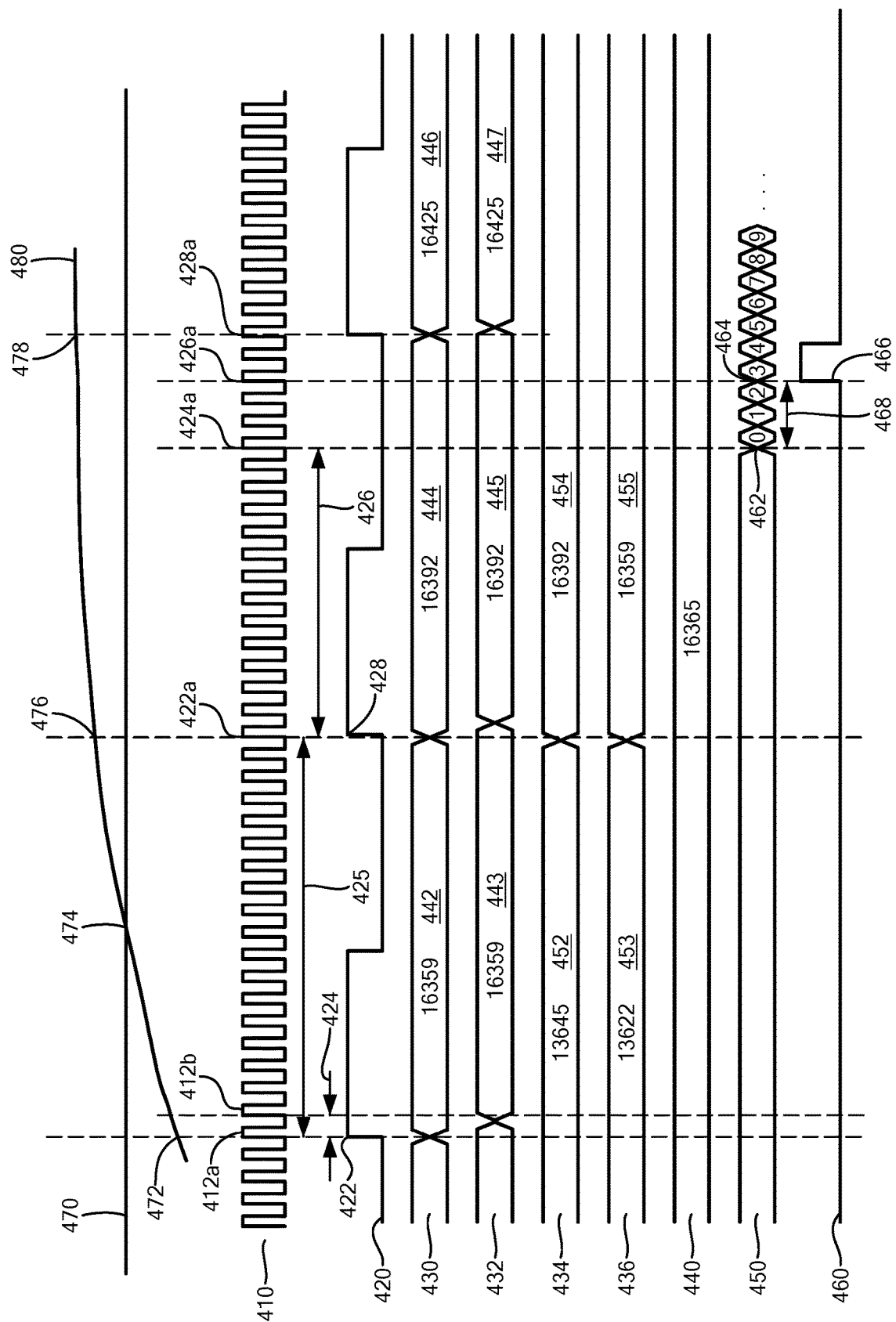
FIG. 4 is a timing diagram illustrating a switchpoint signal generated based upon another embodiment.

Referring now to FIG. 4, a timing diagram 400 illustrates a switchpoint signal generated based upon another embodiment described herein. Signal 410 represents system clock pulses generated by a system clock (e.g., system clock 122 in FIG. 1A). The system clock pulses 412a, 412b are generated according to a predetermined system clock period. Signal 420 represents sample clock pulses generated by a sample clock (e.g., sampling clock 130 in FIG. 1A). The sample clock pulses 422, 428 are generated according to a predetermined sample clock period 425. The value of the system clock period is less than a value of the sample clock period. In embodiments, a number of system clock pulses occurring in a sample clock period is constant. In the illustrative embodiment shown in FIG. 4, eighteen (18) system clock pulses are generated per one (1) sample clock pulse. However, it should be appreciated that the number of system clock pulses occurring in a sample clock period can have a different value.

Sample data 430 shows the value of sample data from sensor signal 480 that is detected at each sampling. For example, for sample clock 422, the sensor signal 480 is detected at point 472 to have a sample data value of 16359. Further, the sensor signal 480 has a sample data value of 16392 and 16425 at points 476 and 478 respectively. In embodiments, the sample data 430 is copied into an internal registry 432 by an interpolation circuit (e.g., 134 in FIG. 1A). The interpolation circuit runs on the system clock. In embodiments, it may take one system clock 424 to copy the sample data into the internal registry 432. The value stored in the internal registry 432 is used to calculate a ratio and delay count. Further, the sample data is stored in a saved previous sample data 434 and a saved current sample data 436. The values in the saved previous sample data 434 and the saved current sample data 436 are updated only when a ratio and a delay count is calculated. The update with the saved values happens when a threshold crossing is detected and the threshold value is between the previous sample value and the current sample value (i.e., previous sample≥threshold≥current sample or previous sample≤threshold≤current sample). For example, in the illustrative example, calculation of delay count happened when previous sample data has 13645 and current sample data has 13622.

Switchpoint value 440 shows a data value corresponding to a crossing switchpoint threshold 470. Here, the threshold value is 16365. Pulse trigger signal 460 represents a switchpoint crossing signal, which is generated for a detected switchpoint. Here, an actual crossing may happen between samplings 422, 428. For example, the sensor signal 480 crosses the threshold 470 at point 474 when the sensor signal has a sample data value of 16365, which is between sample clock pulse 422 when the sensor signal has a sample data value of 16359 and sample clock pulse 428 when the sensor signal has a sample data value of 16392. As described above, the switchpoint 474 is not detected until the next sample clock 328.

As described in conjunction with FIG. 3, a ratio and a delay count are determined based on a sample difference and threshold difference. By applying the formula (1), a delay count is determined as three (3) as below.

$$\text{Delay Count} = \text{Int}\left(18 * \frac{(16365 - 16359)}{(16392 - 16359)} \text{Mod} 18\right) = \text{Int}(3.27) = 3$$

As described above, a switchpoint signal may be generated by applying the delay count after a fixed duration 426. In embodiments, a switchpoint signal circuit (e.g., 136 in FIG. 1A) may apply a fixed calculation time. In the illustrative example, the delay count is calculated in 13 system clock pulses. Here, after a switchpoint 474 is detected at sample clock 438, the switchpoint signal circuit calculates a delay count in a fixed duration 426, which takes 13 system clock pulses. After the fixed duration 426 passes, a counter starts at 462. The delay count is determined 3 (i.e., three (3) system clock pulses 468). When the system clock 410 reaches the determined delay count 464, a switchpoint signal is generated at 466. Since the same fixed duration 426 is applied along with the determined delay count, the delay between the actual crossing 474 and the switchpoint signal generation 466 is substantially constant. Accordingly, the non-deterministic error between the actual crossing 474 and the switchpoint signal generation 466 may be reduced or minimized. For example, in this illustrative embodiment, the range of error between actual crossing and switchpoint signal could be brought down to ~281 ns from ~5.06 us of a conventional method.

Figure 5:
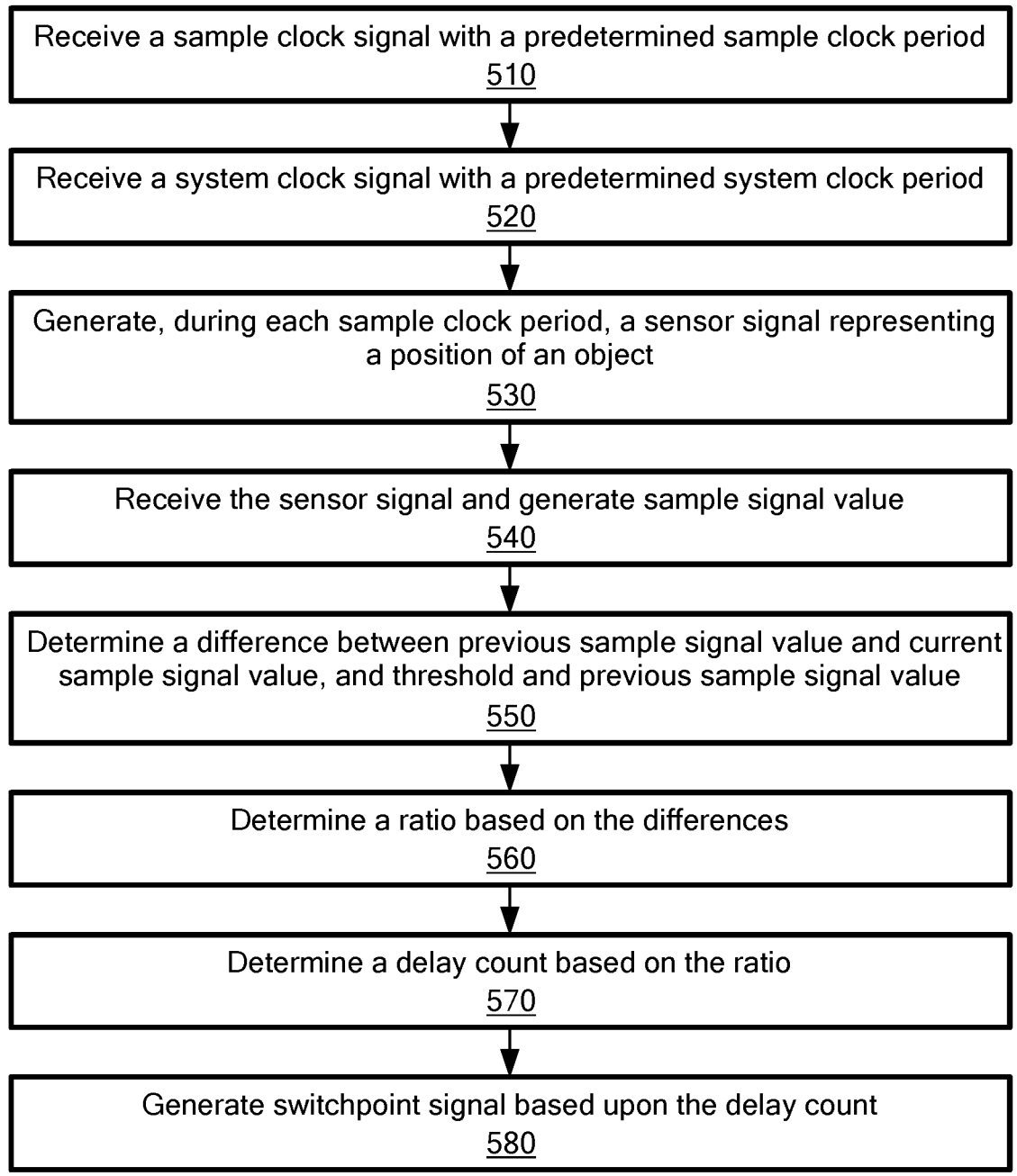
FIG. 5 is a flowchart of a process for generating a switchpoint signal based upon a delay count.

FIG. 5 is a flow diagram illustrating the processing performed by a sensor (e.g., a magnetic field sensor 104 in FIG. 1) to generate a switchpoint signal. The rectangular elements (typified by element 510 in FIG. 3), herein denoted "processing blocks," represent computer software instructions or groups of instructions. The diamond shaped elements (not shown), herein denoted "decision blocks," represent computer software instructions or groups of instructions which affect the execution of the computer software instructions represented by the processing blocks. The flow diagram does not depict the syntax of any particular programming language. Rather, the flow diagram illustrates the functional information one skilled in the art requires to generate computer software to perform the processing required of sensor 104 (and/or a system 600). It should be noted that many routine program elements, such as initialization of loops and variables and the use of temporary variables are not shown. The particular sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order.

Referring now to FIG. 5, processing begins in processing block 510 in which a sample clock signal is received. It should be appreciated that in embodiments, a sample clock (e.g., sample clock 130 in FIG. 1A) may generate such a sample clock signal (i.e., pulse) having a predetermined sample clock period. In processing block 520, a system clock signal is received. It should be appreciated that in embodiments, a system clock (e.g., oscillator 122 in FIG. 1A) may generate such a system clock signal having a predetermined system clock period. Here, the value of the system clock period is less than a value of the sample clock period. For example, for one sample clock period, 18 system clock signals may be generated as shown in FIG. 4. It should be appreciated that the sample clock signals and system clock signals are continuously generated when another processing block in process 500 is being executed.

In processing block 530, when an object (e.g., target 102 in FIG. 1) moves, during each sample clock period, a sensor signal representing a position of the object may be generated. In embodiments, a sensor circuit (e.g., sensor circuit 141 in FIG. 1A) may generate the sensor signal. In processing block 540, the sensor signal is received to generate sample signal value (or referred to sample data). In embodiments, a sampling circuit (e.g., ADC 118, 120 in FIG. 1A) may generate the sensor signal by converting the analog sensor signal to digital sample data.

In processing blocks 550, a sample difference (e.g., 382 in FIG. 3) which is the difference between previous sample signal value and current sample signal value is determined. In addition, a threshold difference (e.g., 384 in FIG. 3) which is the difference between the threshold and previous sample signal value is determined. In processing block 560, a ratio is determined based upon the sample difference and threshold difference. In processing 570, a delay count is determined based upon the ratio. In embodiments, the delay count may be calculated and determined based on the formula (1) described above in conjunction with FIG. 3. In embodiments, an interpolation circuit (e.g., interpolation circuit 134 in FIG. 1A) may perform processing in processing blocks 550-570.

In processing block 580, a switchpoint signal (e.g., 362 in FIG. 3) is generated based upon the delay count. In embodiments, when a switchpoint crossing is detected, a corresponding switchpoint signal is generated by applying the delay count after a fixed duration (e.g., one sample period) as described in conjunction with FIG. 3.

Figure 6:
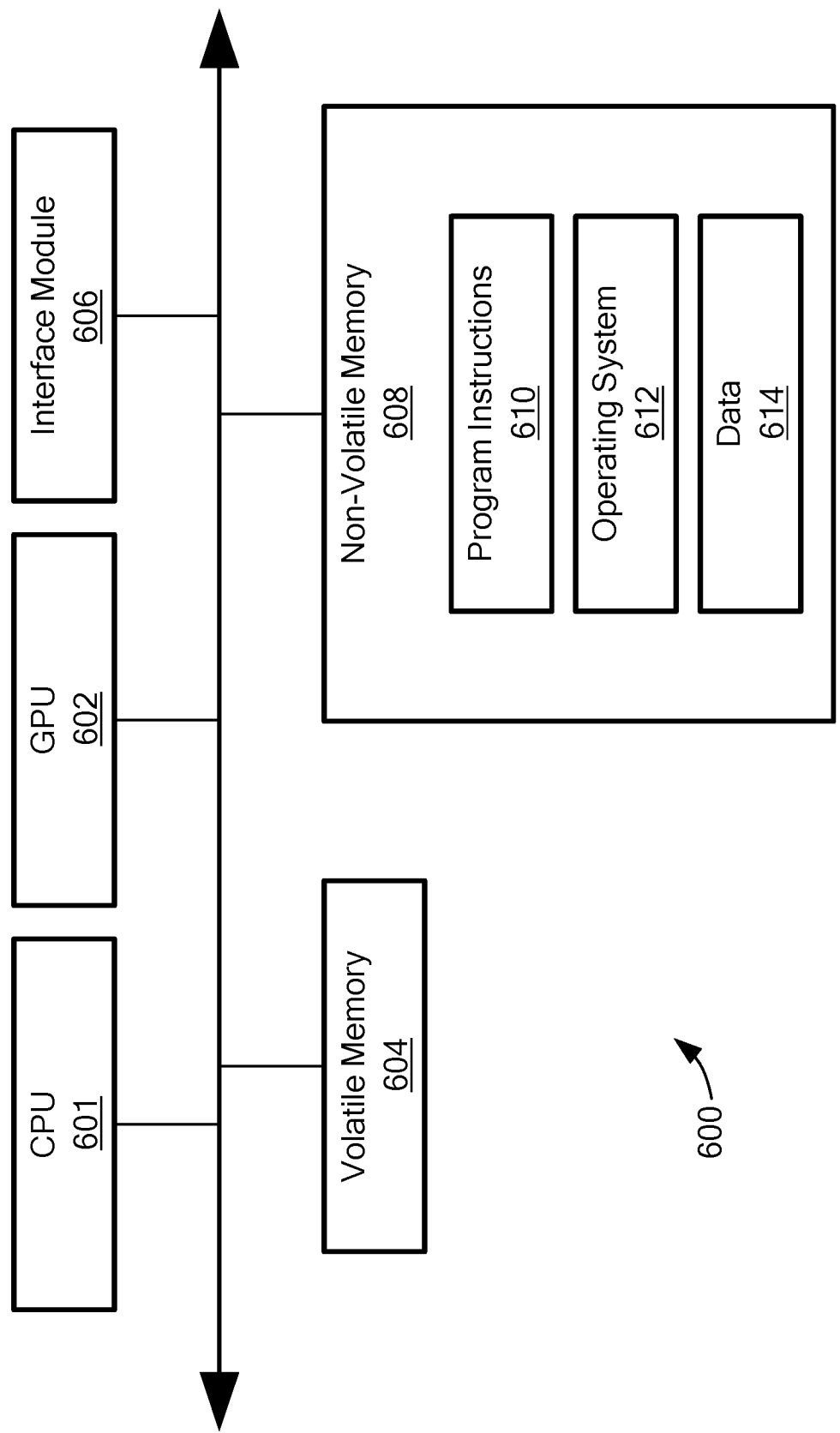
FIG. 6 is a block diagram of an illustrative system on which a process for generating a switchpoint signal based upon a delay count may be executed.

Referring now to FIG. 6, an illustrative implementation of a processing device 600 which may be suitable to implement the processing techniques (e.g., process 500 in FIG. 5) described herein includes a processor 602, a volatile memory 604, a non-volatile memory 608 (e.g., hard disk) and the interface module 608 (e.g., a user interface, USB interface and so forth). The non-volatile memory 608 stores computer instructions 610, an operating system 612 and data 614. In one example, the computer instructions 610 are executed by the processor 602 out of volatile memory 604 to perform all or part of the processes described herein (e.g., process 500).

The processes described herein (e.g., processes 500) is not limited to use with hardware and software of FIG. 1, 1A or 6; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or another article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The inventive concepts described herein is implemented only in digital, and accordingly no additional analog components are required to determine a delay count and generate switchpoint signals based upon the delay count. Accordingly, the illustrative embodiments are more flexible compared with conventional methods because the embodiments may be adapted to any clock relationship and bit width, not requiring a unique filter to be generated for each sensor device. In embodiments, non power-of-2 values are handled without extra effort.

With conventional devices, the sampled values would be up-sampled to the system clock period. This requires an upsampling filter for 2×, 3×, or 4× upsampling. The filter for a 2× is different from a 3× or a 4× for instance, where the 3× filter is more complex than the 2× filter or the 4× filter.

According to the inventive concepts described herein, the clock relationship is a parameter that only affects the counter (i.e., 356 in FIG. 3) and formula (1). Accordingly, the calculation may be performed without requiring an upsampling filter. This also allows for flexibility in the face of scope changes and results in less design changes. Changing the parameter (e.g., number of system clock pulses) from 16 to 17 for example requires less effort than designing a new upsampling filter. Additionally, in some devices having more than one channel (e.g., sensor 104 having two channels of 118 and 120), either multiple upsampling filters would be needed (which would incur a noticeable power penalty) or the upsampling filter would have to be shared between the channels which may complicate the implementation. For example, sensor 104 in FIG. 1A has two channels of 118 and 120 that are associated with downstream logic (not shown)

in the processor 124. Each of the channels would consist of at least one ADC, one or more filtering or other signal conditionings, and threshold determination (including finding the maxima and minima of the signal), which becomes a complete signal path. Accordingly, requiring more than one channel may complicate the implementation. The inventive concepts described herein needed multiplexing and context storage, which can be shared between channels.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

What is claimed is:

1. A magnetic field sensor comprising:
a sampling clock circuit configured to:
generate a sample clock signal with a predetermined sample clock period;
a system clock circuit configured to:
generate a system clock signal with a predetermined system clock period, wherein a value of the system clock period is less than a value of the sample clock period;
a sensor circuit configured to:
generate, during each sample clock period, a sensor signal representing a position of an object;
a sampling circuit configured to:
receive the sensor signal and generate sample signal value in response thereto;
an interpolation circuit configured to:
determine a first difference between a current sample signal value and a previous sample signal value;
determine a second difference between a switchpoint threshold value and the previous sample signal value; and
determine a delay count based upon a ratio of the first difference and the second difference; and
a switchpoint signal circuit configured to:
generate a switchpoint signal based upon the delay count.

2. The magnetic field sensor of claim 1, wherein the switchpoint signal circuit is further configured to:
start a counter when a fixed duration passes after a detection of a switchpoint, wherein the counter increases for each system clock signal; and
generate the switchpoint signal when the counter reaches the delay count.

3. The magnetic field sensor of claim 2, wherein the fixed duration comprises the predetermined sample clock period.

4. The magnetic field sensor of claim 2, wherein the fixed duration comprises a number of system clock signals to determine the delay count.

5. The magnetic field sensor of claim 1, wherein the delay count is determined by multiplying the ratio by a number of system clock signals occurring in a sample clock period and applying a modulo operation to the number of the system clock signals.

6. The magnetic field sensor of claim 1, wherein the sensor circuit comprises:
one or more magnetic field sensors configured to detect an external magnetic field of the object.

7. The magnetic field sensor of claim 1, wherein the delay count is determined digitally.

8. The magnetic field sensor of claim 1, wherein the delay count is determined using a formula of:

$$\text{Delay Count} = \text{Int}\left(SC * \frac{\text{Threshold Difference}}{\text{Sample Difference}} \text{Mod}(SC)\right),$$

in which SC is a number of system clock signals occurring in a sample clock period.

9. A method comprising:
generating a sample clock signal with a predetermined sample dock period;
generating a system clock signal with a predetermined system clock period, wherein a value of the system clock period is less than a value of the sample dock period;
generating, during each sample clock period, a sensor signal representing a position of an object;
receiving the sensor signal and generate sample signal value in response thereto;
determining a first difference between a current sample signal value and a previous sample signal value;
determining a second difference between a switchpoint threshold u the previous sample signal value;
determining a delay count based upon a ratio of the first difference and the second difference; and
generating a switchpoint signal based upon the delay count.

10. The method of claim 9 further comprising:
starting a counter when a fixed duration passes after a detection of a switchpoint, wherein the counter increases for each system dock signal; and
generating the switchpoint signal when the counter reaches the delay count.

11. The method of claim 10, wherein the fixed duration comprises the predetermined sample clock period.

12. The method of claim 10, wherein e fixed duration comprises a number of system clock signals to determine the delay count.

13. The method of claim 9, wherein the delay count is determined by multiplying the ratio by a number of system clock signals occurring in a sample clock period and applying a modulo operation to the number of the system clock signals.

14. The method of claim 9, wherein the delay count is determined using a formula of:

$$\text{Delay Count} = \text{Int}\left(SC * \frac{\text{Threshold Difference}}{\text{Sample Difference}} \text{Mod}(SC)\right),$$

in which SC is a number of system clock signals occurring in a sample clock period.

15. An apparatus method comprising:
means for generating a sample clock signal with a predetermined sample clock period;
means for generating a system clock signal with a predetermined system clock period, wherein a value of the system clock period is less than a value of the sample clock period;
means for generating, during each sample clock period, a sensor signal representing a position of an object;
means for receiving the sensor signal and generating a sample signal value in response thereto;

means for determining a first difference between a current sample signal value and a previous sample signal value;

means for determining a second difference between a switchpoint threshold value and the previous sample signal value;

means for determining a delay count based upon a ratio of the first difference and the second difference; and means for generating a switchpoint signal based upon the delay count.

16. The apparatus of claim 15 further comprising:

means for starting a counter when a fixed duration passes after a detection of a switchpoint, wherein the counter increases for each system clock signal; and means for generating the switchpoint signal when the counter reaches the delay count.

17. The apparatus of claim 16, wherein the fixed duration comprises the predetermined sample clock period.

18. The apparatus of claim 16, wherein the fixed duration comprises a number of system clock signals to determine the delay count.

19. The apparatus of claim 15, wherein the delay count is determined by multiplying the ratio by a number of system clock signals occurring in a sample clock period and applying a modulo operation to the number of the system clock signals.

20. The apparatus of claim 15, wherein the delay count is determined using a formula of:

$$\text{Delay Count} = \text{Int}\left(SC * \frac{\text{Threshold Difference}}{\text{Sample Difference}} \text{Mod}(SC)\right),$$

in which SC is a number of system clock signals occurring in a sample clock period.

* * * * *

UNITED STATES PATENT AND TRADEMARK OFFICE
CERTIFICATE OF CORRECTION

| | |
|---|---|
| PATENT NO. | : 10,866,288 B2 |
| APPLICATION NO. | : 16/411329 |
| DATED | : December 15, 2020 |
| INVENTOR(S) | : Steven E. Snyder |

It is certified that error appears in the above-identified patent and that said Letters Patent is hereby corrected as shown below:

In the Specification

Column 2, Line 3 delete "generate sample" and replace with --generating a sample--.

Column 2, Line 39 delete "embodiment. a" and replace with --embodiment, a--.

Column 2, Line 45 delete "generate sample" and replace with --generating a sample--.

Column 3, Line 39 delete "and unless" and replace with --and, unless--.

Column 4, Lines 43-47 delete "As is known in the art, magnetic fields have direction and strength. The strength of a magnetic field can be described as magnetic flux or flux density. Therefore, the terms magnetic field "strength" and magnetic "flux" may be used interchangeably in this document.".

Column 4, Line 67 delete "can be an analog" and replace with --can be analog--.

Column 5, Lines 17-18 delete ""jitter (also known as 'repeatability')"" and replace with --"jitter" (also known as "repeatability")--.

Column 6, Line 1 delete "drive, ABS," and replace with --drive, anti-lock braking system (ABS),--.

Column 6, Line 13 delete "by magnetic" and replace with --by a magnetic--.

Column 6, Line 14 delete "sensor including, but is not limited to:" and replace with --sensor, including, but not limited to:--.

Column 6, Line 41 delete "element" and replace with --elements--.

Column 6, Line 46 delete "signal" and replace with --signals--.

Signed and Sealed this
Ninth Day of August, 2022

Katherine Kelly Vidal
*Director of the United States Patent and Trademark Office*

CERTIFICATE OF CORRECTION (continued)
U.S. Pat. No. 10,866,288 B2

Column 8, Line 5 delete "that, if" and replace with --that if--.

Column 8, Line 13 delete "ADC's'" and replace with --ADCs--.

Column 8, Line 14 delete "Accordingly. the" and replace with --Accordingly, the--.

Column 8, Line 15 delete "signal channel" and replace with --single channel--.

Column 8, Line 22 delete "115a. of" and replace with --115a of--.

Column 8, Line 33 delete "be non-crystal" and replace with --be a non-crystal--.

Column 9, Line 13 delete "samples and signal" and replace with --samples signal--.

Column 9, Line 26 delete "detected, to" and replace with --detected to--.

Column 10, Line 28 delete "generate" and replace with --generates--.

Column 10, Line 57 delete "cloth" and replace with --clock--.

Column 11, Line 10 delete "1118a" and replace with --118a--.

Column 11, Line 15 delete "105000" and replace with --10500--.

Column 13, Line 10 delete "embodiments the" and replace with --embodiments, the--.

Column 13, Line 53 delete "sample-" and replace with --sample--.

Column 13, Line 54 delete "sample-" and replace with --sample--.

Column 14, Line 34 delete "us" and replace with --µs--.

Column 15, Line 21 delete "blocks" and replace with --block--.

Column 15, Line 54 delete "processes 500" and replace with --process 500--.

Column 15, Line 55 delete "FIG." and replace with --FIGS.--.

In the Claims

Column 18, Line 14 delete "dock" and replace with --clock--.

Column 18, Line 17 delete "dock" and replace with --clock--.

Column 18, Line 22 delete "generate sample" and replace with --generating a sample--.

CERTIFICATE OF CORRECTION (continued)
U.S. Pat. No. 10,866,288 B2

Column 18, Line 27 delete "threshold u the" and replace with --threshold value and the--.

Column 18, Line 34 delete "dock" and replace with --clock--.

Column 18, Line 39 delete "wherein e fixed" and replace with --wherein the fixed--.